United States Patent
Harley et al.

(10) Patent No.: US 11,398,576 B2
(45) Date of Patent: *Jul. 26, 2022

(54) SOLAR CELL HAVING A PLURALITY OF SUB-CELLS COUPLED BY A METALLIZATION STRUCTURE

(71) Applicant: SunPower Corporation, San Jose, CA (US)

(72) Inventors: Gabriel Harley, Mountain View, CA (US); Michael Morse, San Jose, CA (US); Peter John Cousins, Los Altos, CA (US)

(73) Assignee: SunPower Corporation, San Jose (CA)

( * ) Notice: Subject to any disclaimer, the term of this patent is extended or adjusted under 35 U.S.C. 154(b) by 0 days.

This patent is subject to a terminal disclaimer.

(21) Appl. No.: 16/832,819

(22) Filed: Mar. 27, 2020

(65) Prior Publication Data

US 2020/0279967 A1    Sep. 3, 2020

Related U.S. Application Data

(60) Continuation of application No. 15/856,564, filed on Dec. 28, 2017, now Pat. No. 10,608,133, which is a
(Continued)

(51) Int. Cl.
*H01L 31/05*     (2014.01)
*H01L 31/0475*   (2014.01)
(Continued)

(52) U.S. Cl.
CPC ........ *H01L 31/0516* (2013.01); *H01L 31/028* (2013.01); *H01L 31/048* (2013.01);
(Continued)

(58) Field of Classification Search
None
See application file for complete search history.

(56) References Cited

U.S. PATENT DOCUMENTS

| 4,612,408 | A | 9/1986 | Moddel et al. |
| 4,754,544 | A | 7/1988 | Hanak |

(Continued)

FOREIGN PATENT DOCUMENTS

| CN | 102867818 | 1/2013 |
| CN | 103236475 | 8/2013 |

(Continued)

OTHER PUBLICATIONS

First Report of an Official Communication from European Patent Application No. 15769730 dated Mar. 30, 2020, 4 pgs.
(Continued)

*Primary Examiner* — Michelle Mandala
(74) *Attorney, Agent, or Firm* — Schwabe, Williamson & Wyatt, P.C.

(57) ABSTRACT

Solar cells having a plurality of sub-cells coupled by metallization structures, and singulation approaches to forming solar cells having a plurality of sub-cells coupled by metallization structures, are described. In an example, a solar cell, includes a plurality of sub-cells, each of the sub-cells having a singulated and physically separated semiconductor substrate portion. Adjacent ones of the singulated and physically separated semiconductor substrate portions have a groove there between. The solar cell also includes a monolithic metallization structure. A portion of the monolithic metallization structure couples ones of the plurality of sub-cells. The groove between adjacent ones of the singulated and physically separated semiconductor substrate portions exposes a portion of the monolithic metallization structure.

23 Claims, 10 Drawing Sheets

Related U.S. Application Data continuation of application No. 15/348,215, filed on Nov. 10, 2016, now Pat. No. 9,893,222, which is a division of application No. 14/229,543, filed on Mar. 28, 2014, now Pat. No. 9,496,437.

(51) Int. Cl.

| | | |
|---|---|---|
| *H01L 31/028* | (2006.01) | |
| *H01L 31/048* | (2014.01) | |
| *H01L 31/068* | (2012.01) | |
| H01L 31/0236 | (2006.01) | |
| H01L 31/18 | (2006.01) | |

(52) U.S. Cl.
CPC ...... *H01L 31/0475* (2014.12); *H01L 31/0504* (2013.01); *H01L 31/0682* (2013.01); *H01L 31/02363* (2013.01); *H01L 31/1876* (2013.01); *Y02E 10/547* (2013.01); *Y02P 70/50* (2015.11)

(56) References Cited

U.S. PATENT DOCUMENTS

| | | | |
|---|---|---|---|
| 5,100,808 | A | 3/1992 | Glenn |
| 5,164,019 | A | 11/1992 | Sinton |
| 5,972,732 | A | 10/1999 | Gee et al. |
| 6,441,297 | B1 | 8/2002 | Keller et al. |
| 10,608,133 | B2 * | 3/2020 | Harley .................. H01L 31/028 |
| 2003/0160251 | A1 | 8/2003 | Wanlass et al. |
| 2005/0145274 | A1 | 7/2005 | Polce et al. |
| 2008/0023065 | A1 | 1/2008 | Borden et al. |
| 2009/0194150 | A1 | 8/2009 | Aoki |
| 2009/0242020 | A1 | 10/2009 | Myong |
| 2010/0012172 | A1 | 1/2010 | Meakin et al. |
| 2010/0059109 | A1 | 3/2010 | Nakayashiki et al. |
| 2010/0236603 | A1 | 9/2010 | Menard et al. |
| 2012/0006393 | A1 * | 1/2012 | Cruz .................. H01L 31/02245 136/256 |
| 2013/0037962 | A1 | 2/2013 | Xue |
| 2013/0056758 | A1 | 3/2013 | Ziltener et al. |
| 2013/0307147 | A1 | 11/2013 | Liu |
| 2014/0087542 | A1 * | 3/2014 | Grivna .............. H01L 21/67063 438/464 |
| 2014/0162399 | A1 | 6/2014 | Cudzinovic et al. |
| 2015/0020881 | A1 | 1/2015 | Cruz et al. |
| 2015/0136227 | A1 | 5/2015 | Moslehi et al. |
| 2015/0155398 | A1 | 6/2015 | Moslehi et al. |
| 2015/0187969 | A1 | 7/2015 | Moslehi et al. |
| 2015/0194547 | A1 | 7/2015 | Moslehi et al. |
| 2015/0200313 | A1 | 7/2015 | Moslehi et al. |
| 2016/0240705 | A1 | 8/2016 | Takahama |

FOREIGN PATENT DOCUMENTS

| | | | | |
|---|---|---|---|---|
| CN | 103247651 | | 8/2013 | |
| DE | 102012217078 | A1 * | 3/2014 | ......... H01L 31/1804 |
| JP | 2005-191479 | | 7/2005 | |
| JP | 2012-033720 | | 2/2012 | |
| JP | 2013-048166 | | 3/2013 | |
| TW | 201327878 | A | 7/2013 | |
| WO | WO 2011084053 | | 7/2011 | |
| WO | WO 2013/008617 | | 1/2013 | |
| WO | WO 2013005475 | | 1/2013 | |
| WO | WO 2013085387 | | 6/2013 | |
| WO | WO 2013102181 | | 7/2013 | |

OTHER PUBLICATIONS

International Search Report and Written Opinion from PCT/US2015/022338 dated Jun. 19, 2015, 13 pgs.
First Action Interview Pre-Interview Communication from U.S. Appl. No. 14/229,543 dated Sep. 18, 2015, 7 pgs.
First Action Interview Office Action from U.S. Appl. No. 14/229,543 dated Feb. 3, 2016, 6 pgs.
International Preliminary Report on Patentability from PCT/US2015/022338 dated Oct. 4, 2016, 11 pgs.
First Action Interview Pre-Interview Communication from U.S. Appl. No. 15/348,215 dated Feb. 23, 2017, 5 pgs.
First Action Interview Office Action from U.S. Appl. No. 15/348,215 dated May 25, 2017, 5 pgs.
European Search Report from European Patent Application No. EP15769730.1 dated Jul. 25, 2017, 25 pgs.
Notice of First Office Action from Chinese Patent Application No. 2015800099876 dated Oct. 9, 2017, 8 pgs.
Notice of First Office Action from Chilean Patent Application No. 02444-2016 dated Dec. 14, 2017, 6 pgs.
Second Office Action for Chilean Patent Application No. 02444-2016 dated May 23, 2018, 6 pgs.
Office Action for Application No. 104109856 dated Nov. 20, 2018, 9 pgs.
First Action Interview Pre-Interview Communication from U.S. Appl. No. 15/856,564 dated Dec. 7, 2018, 20 pgs.
Non Final Notice of Reasons for Rejection for Japanese Application No. 2016-544468 dated Feb. 27, 2019, 3 pgs.
First Action Interview Office Action from U.S. Appl. No. 15/856,564 dated Mar. 12, 2019, 10 pgs.
Final Office Action from U.S. Appl. No. 15/856,564 dated Jul. 12, 2019, 12 pgs.
Decision on Rejection for Japanese Application No. 2016-544468, dated Nov. 12, 2019; 3 pgs.
First Communication from European Patent Application No. 15769730.1 dated Mar. 30, 2020, 4 pgs.
Gabor, et al., Mini-Monolithic Module Development Using Small Wraparound Cells, 17th European Photovoltaic Solar Energy Conference, Oct. 22-26, 2001, Munich, Germany, pp. 654-657.
Lee, et al., "Solar cell and manufacturing method thereof," published by the Korean Intellectual Property Office, Publication No. KR2002-0061291 Publication Date Jul. 24, 2002, Samsung SDI Co. as the applicant, 13 pgs.
Examination Report from European Patent Application No. 15769730.1 dated Aug. 9, 2020, 4 pgs.
Notice of Reasons for Refusal from Japanese Patent Application No. 2020-043437 dated Mar. 31, 2021, 5 pgs.
First Office Action from Chinese Patent Application No. 2018108844497 dated Jul. 8, 2021, 14 pgs.
Subsequent Substantive Examination Report from Philippines Patent Application No. 1-2016-501676 dated May 9, 2019, 4 pgs.
Notice of Refusal from Japanese Patent Application No. 2020-043437 dated Nov. 1, 2021, 5 pgs.
Second Office Action from Chinese Patent Application No. 2018108844497 dated Feb. 9, 2022, 12 pgs.

* cited by examiner

SOLAR CELL HAVING A PLURALITY OF SUB-CELLS COUPLED BY A METALLIZATION STRUCTURE

CROSS-REFERENCE TO RELATED APPLICATIONS

This application is a continuation of U.S. application Ser. No. 15/856,564, filed Dec. 28, 2017, which is a continuation of U.S. application Ser. No. 15/348,215, filed Nov. 10, 2016, now U.S. Pat. No. 9,893,222, issued Feb. 13, 2018, which is a divisional of U.S. patent application Ser. No. 14/229,543, filed on Mar. 28, 2014, now U.S. Pat. No. 9,496,437, issued Nov. 15, 2016, the entire contents of which are hereby incorporated by reference herein.

TECHNICAL FIELD

Embodiments of the present disclosure are in the field of renewable energy and, in particular, solar cells having a plurality of sub-cells coupled by metallization structures, and singulation approaches to forming solar cells having a plurality of sub-cells coupled by metallization structures.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Solar cells having a plurality of sub-cells coupled by metallization structures, and singulation approaches to forming solar cells having a plurality of sub-cells coupled by metallization structures, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as solar cell emitter region fabrication techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells having a plurality of sub-cells coupled by metallization structures. In an embodiment, a solar cell, includes a plurality of sub-cells, each of the sub-cells having a singulated and physically separated semiconductor substrate portion. Adjacent ones of the singulated and physically separated semiconductor substrate portions have a groove there between. The solar cell also includes a monolithic metallization structure. A portion of the monolithic metallization structure couples ones of the plurality of sub-cells. The groove between adjacent ones of the singulated and physically separated semiconductor substrate portions exposes a portion of the monolithic metallization structure.

Also disclosed herein are singulation approaches to forming solar cells having a plurality of sub-cells coupled by metallization structures. In an embodiment, a method of fabricating a solar cell involves forming a metallization structure on a first surface of a semiconductor substrate. The method also involves scribing the semiconductor substrate from a second, opposite, surface of the semiconductor substrate. The scribing is stopped by and exposing portions of the metallization structure from the second surface.

In another embodiment, a method of fabricating a solar cell having a semiconductor substrate having a first surface involves forming an interconnect between at least two sub-solar cells of the solar cell directly on the first surface of the semiconductor substrate to provide an electrical inter-cell connection there between before dicing the semiconductor substrate up to the first surface to physically isolate the at least two sub-solar cells.

More generally, embodiments are directed to the use of metallization as a handle to enable dicing or singulation of solar cell wafers without increasing module interconnections or requiring handling of smaller cells. In an exemplary embodiment, a single solar cell (e.g., 125 cm, 156 cm, 210 cm) is subdivided into smaller cells to allow for flexibility in module current and voltage, as well as flexibility in the metallization. As an example, a single silicon P/N diode has an open circuit voltage (Voc) of 0.6 to 0.74 V. A maximum power voltage (Vmp) may be approximately 0.63V for a solar cell. Thus, single diode cells will have a voltage of 0.63V. If 10 sub-diodes are produced on a single full-area wafer, and connected in series, the voltage would be 6.3V for the entire cell (at roughly $\frac{1}{10}^{th}$ the current, or about 0.5 A for a standard cell). An application for a cell of such a voltage range may be USB charging specification 1.2. If 96 cells of this voltage were to be arranged in series in a module, the module operating voltage would be approximately 604.8V DC. An application for a module with such a voltage range is for simplifying the power electronics inside inverters that make the voltage conversion from low volt DC to high volt (approximately 240 Vrms) AC applications.

Having the ability to control the voltage conversely allows control over the current, which ultimately dictates the thickness of the metal required for a finished device, since power loss is associated with resistive losses in the metal. For example, for an interdigitated back contact (IBC) cell on a 5 inch wafer, the nominal finger length is 125 mm long, and requires approximately 30 microns of plated copper (Cu) to prevent grid losses. Moving to a 6 inch wafer extends the finger length to 156 millimeters, and since resistive losses go by the length squared, this may require a metal thickness of approximately 48 microns. The potential adds substantial cost to metallization, e.g., by having more direct material costs and by reducing the throughput of the tools. Thus, the ability to control the finger length and cell parametrics by moving to multiple diode solutions can allow for greater flexibility in the processing of solar cell metallization. In particular, for applications on larger cells, increasing the size of the cell also produces more current. Additionally, temperature of the devices in operation in the field is dependent on the current and generally should be minimized to avoid accelerated aging affects, and risks of higher temperatures should cells enter reverse bias. Furthermore, in general, lower current will improve the overall reliability of the module.

In an embodiment, the metallization scheme is used to hold and provide mechanical integrity for the sub-cells together within the parent cell, such that additional handling complexity is not necessarily required when building the module, and the cells remain physically separated. Some embodiments further involve the use of built-in strain-relief within the sub-cell interconnects. Embodiments described may enable scalability to larger wafers without handling complexity or metallization issues in manufacturing, or increased field reliability concerns.

To provide context, when moving toward solar cell fabrication using larger wafers having a single diode formed on the wafer, a larger current is generated. Such increased current typically requires thicker metal to avoid Rs losses, which can add cost and complexity to a manufactured solar cell. A state-of-the-art industry solution involves dicing of the cells into smaller individual diodes, e.g., 2, 4, 16, etc., such that the current is reduced both by smaller area, as well as by shorter current transport lengths along the contact fingers. However, two issues often arise when implementing this approach. First, individual components are generated, in that each sub-cell needs to be handled and interconnected. Accordingly, an increased number of cell-to-cell interconnects are required, and handling of different sized, smaller wafers within the cell is needed. Second, sub-components are sometimes generated on a template (e.g., a backplane), which ties the sub-cells together. One issue associated with such an approach is the cost of the backplane, and the complexity of bonding through the backplane. Furthermore, for optimal performance of the system, the current of each sub-cell should be matched, which provides a complication for pseudo-square single crystalline wafers due to the various axes of symmetry, as well as 'dead' spaces on cells from, e.g., plating or testing pads, or interconnections pads. This provides some geometric constraints. Additionally, where the metal is required to physically hold the sub-cell assembly together without shunting to neighboring sub-cells, this provides some challenges, e.g., for in-series ¼ cell designs require novel emitter and metal configurations to hold the cell together without individual component handling.

In order to address above issues, one or more embodiments described herein involve implementation of a monolithic metallization structure effectively as a backplane to tie the sub-cells together before singulation. This approach enables an inter-cell connection on a corresponding parent cell that does not require individual sub-cell handling or additional levels of metal interconnects. Furthermore, it allows for build-in metallization of the interconnects and therefore removes or substantially reduces any dead space from traditional interconnection pads. It is to be appreciated that using the metal or metallization structure to tie the cells together can involve new challenges and risk. For example, each sub-cells should typically have the same current and voltage properties, in that they all should typically have the same area. In a specific embodiment, for a pseudo-square configuration, an emitter and metal design may need to be fabricated in a way that allows for simple interconnection. In accordance with embodiments described herein, several exemplary layouts using half cell, quarter cell, 10- or 6-cell designs are described in greater detail below. Additionally, one or more embodiments described herein can be implemented without the use of a backplane distinct from a back side metallization structure. Some embodiments are directed to back contact solar cells, and some embodiments enable the fabrication of diced multi-diode cells with controllable voltage and current, modules with variable voltage and current, and the fabrication of relatively large cells.

In accordance with additional embodiments described herein, approaches are described for addressing the risk of inter-sub-cell metal failure, e.g., by providing approaches for inter-cell strain-relief. In an exemplary embodiment, a design that builds in strain relief for the inter-cell interconnects is implemented along with the singulation approaches described above.

In yet additional embodiments, approaches are described for addressing the risk of power loss from diced cells. In an exemplary embodiment, approaches for reducing the edge losses are implemented. In one such embodiment, pre-grooving is performed prior to texturizing a light-receiving surface of the solar cell. This is followed by a break process and, possibly, a post-isolation passivation process. In one such embodiment, the emitter is designed so that the scribe falls primarily or entirely within the N-doped region, which has a lower recombination rate when unpassivated than the unpassivated P-doped region, and therefore results in significantly less power loss. In another embodiment, the emitter and scribe are designed so that there is little or no intersection of the scribe with a P-N junction, since unpassivated junctions have significantly higher recombination resulting in more power loss. Furthermore, in an embodiment, with the understanding that certain laser parameters may result in side-wall damage, melting, and disruption of the insulating dielectric stack on the rear side, the laser parameters are selected so as to minimize such damage, melting, and disruption. Typically, this drives a laser selection to shorter pulse-lengths (e.g., less than approximately 10 nanoseconds), and processes that stop short of disrupting the rear dielectric (e.g., groove followed by mechanical separation).

In further embodiments, approaches are described for addressing the risk of damage of the metal during a substrate or wafer (e.g., silicon) isolation process. In an exemplary embodiment, damage is eliminated or at least mitigated by using a buffer material as an ablation stop, such that the metal is not directly scribed.

Additional risks can involve shunting through the base, e.g., by not totally isolating the Si, or having the isolated Si regions touch each other during cycling. One or more embodiments address such issues by introducing an encapsulant to fill a groove between individual silicon portions in order to mitigate the risk of shunting and wear of the silicon. In one such embodiment, a metal-tolerant passivation material is used as a primary or secondary anti-reflective coating (ARC) layer to passivate and insulate the edge.

As described in greater detail below in association with the Figures, specific embodiments described herein can be implemented based on the understanding that metal or metallization structures having a thickness of greater than approximately 20 microns can be used to prevent power loss otherwise associated with silicon (Si)-cracking in a solar cell by using the metal to hold the cell together. Embodiments described herein provide a metal structure (e.g., by plating, or foil, or ribbon, etc.) that is bonded to a full-area wafer having sub-cells. The metal is patterned such that the sub-cell interconnects are formed in the same operation as the sub-cell metallization. Furthermore, the sub-cells are arranged within the full cell such that the Si can be isolated to provide an integer number of sub-diodes, connected through the resulting metallization structure. For some embodiments, such an arrangement may require that parallel diode configurations be used (e.g., 2, 4, etc), examples of which are described in greater detail below. Following connection using a metallization structure of sufficient thickness, the diodes may be isolated. In one such embodiment, the metal is patterned during plating or formation to include a strain relief feature between the cells, such as with a rounded groove. Subsequent to isolation, the edges can passivated and/or insulated, both to limit power loss from recombination at the edge, and also to provide insulation against shunting.

Figure 1A:
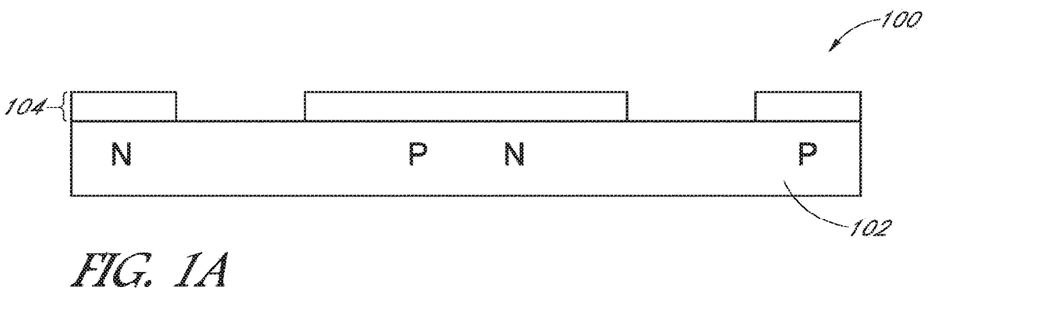
FIG. 1A illustrates a cross-sectional view of a solar cell prior to singulation to form physically separated sub-cells, in accordance with an embodiment of the present disclosure.
Figure 1B:
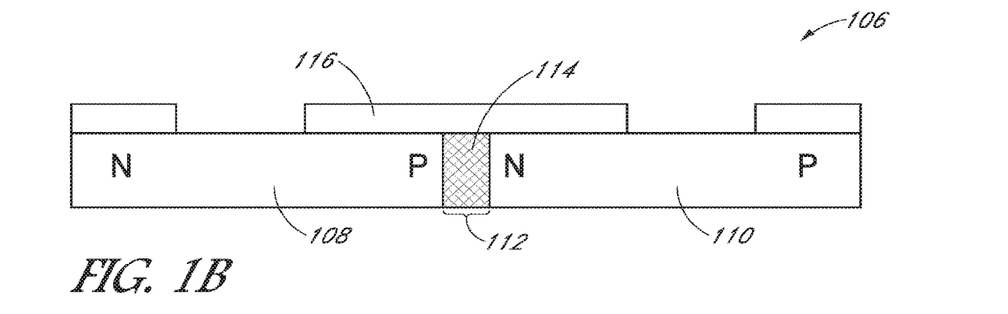
FIG. 1B illustrates a cross-sectional view of a solar cell subsequent to singulation to form physically separated sub-cells, in accordance with an embodiment of the present disclosure.

As an exemplary representation of the concepts involved herein, FIGS. 1A and 1B illustrate cross-sectional views of a solar cell prior to and subsequent to, respectively, singulation to form physically separated sub-cells, in accordance with an embodiment of the present disclosure.

Referring to FIG. 1A, a solar cell 100 includes a substrate 102 having a metallization structure 104 disposed thereon. The solar cell 100 includes alternating N-type and P-type regions in or above the substrate 102. In one embodiment, the metallization structure 104 is a monolithic metallization structure, as is described in greater detail below. Referring to FIG. 1B, the solar cell 100 has been singulated or diced to provide a solar cell 106 having sub-cells 108 and 110 which are physically separated from one another. In one embodiment, the solar cell 100 is singulated using laser ablation, which is described in greater detail below. In an embodiment, a resulting groove 112 formed upon singulation is filled with an encapsulant material 114, as is depicted in FIG. 1B. In an embodiment, as is also depicted in FIG. 1B, a portion 116 of the metallization structure 104 bridges the two sub-cells 108 and 110. In a particular embodiment, the sub-cells 108 and 110 provide series or parallel diode structures, examples of which are described in detail below.

Figure 2:
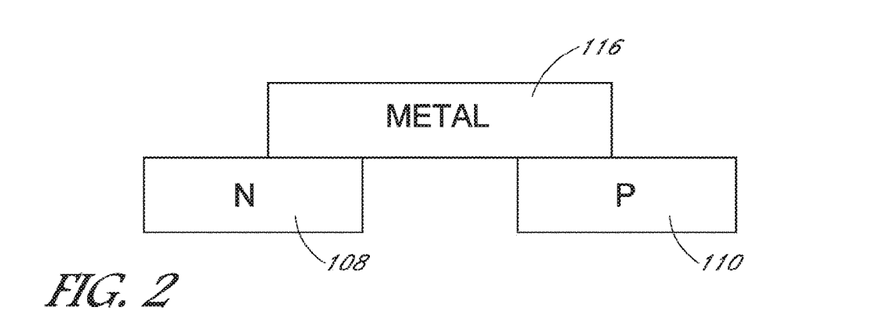
FIG. 2 illustrates a cross-sections view of a portion of a pair of singulated sub-cells using metal as a back-stop for cell singulation, in accordance with an embodiment of the present disclosure.

Referring again to FIGS. 1A and 1B, the portion 116 of the metallization structure 104 is used as both mechanical support and a back-stop during dicing, e.g., during laser ablation of the substrate 102 material. In a first particular example, FIG. 2 illustrates a cross-sections view of a portion of a pair of singulated sub-cells using metal as a back-stop for cell singulation, in accordance with an embodiment of the present disclosure. Referring to FIG. 2, the sub-cells 108 and 110 are formed upon singulation of the substrate 102, having the groove 112 there between. The portion 116 of the metallization structure 104 is formed directly on the back surface of substrate 102 and, as such, a metal or metallic region is used as a back-stop during singulation.

Figure 3:
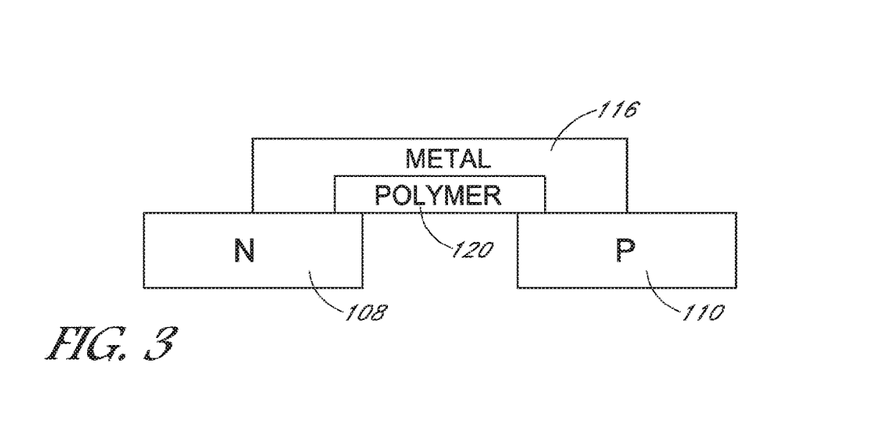
FIG. 3 illustrates a cross-sections view of a portion of a pair of singulated sub-cells using a polymer or other non-metal as a back-stop for cell singulation, in accordance with an embodiment of the present disclosure.

In a second particular example, FIG. 3 illustrates a cross-sections view of a portion of a pair of singulated sub-cells using a buffer material as a back-stop for cell singulation, in accordance with an embodiment of the present disclosure. Referring to FIG. 3, the sub-cells 108 and 110 are formed upon singulation of the substrate 102, having the groove 112 there between. However, the portion 116 of the metallization structure 104 is formed on a polymer region 120, which in turn is formed directly on the back surface of substrate 102 and, as such, polymeric or other metal or non-metal region is used as a back-stop during singulation. In either of the cases of FIGS. 2 and 3, it is to be appreciated that, in an embodiment, the metallization structure 104 can be viewed as a monolithic metallization structure, as described in greater detail below. Furthermore, in an embodiment, in either case, a sub-cell interconnect is fabricated in a same operation as the sub-cell metal. Alternatively, a sub-cell interconnect may be externally applied, but additional processing operations would be needed.

Referring again to FIGS. 1A, 1B and 2, more generally, in an embodiment, a solar cell includes a plurality of sub-cells. Each of the sub-cells has a singulated and physically separated semiconductor substrate portion. Adjacent ones of the singulated and physically separated semiconductor substrate portions have a groove there between. The solar cell also includes a metallization structure. A portion of the metallization structure couples ones of the plurality of sub-cells. Furthermore, the groove between adjacent ones of the singulated and physically separated semiconductor substrate portions exposes a portion of the metallization structure.

In an embodiment, the metallization structure is fabricated from a foil (e.g., a conductive foil, such as an aluminum foil with or without an additional seed layer) or is fabricated by a plating process. In one such embodiment, in the case that a relatively thick (e.g., greater that approximately 25 microns) back metal is used, some tolerance for partial laser ablation into the metal may be accommodated. However, if a thin metallization structure is used (e.g., less than approximately 25 microns), ablation may need to be halted without any scribing of the metallization structure, so as to maintain the electrical and physical integrity of the metal required to survive reliability testing. The metallization structure may be fabricated by plating, printing, by use of a bonding procedure (e.g., in the case of a foil), or may be fabricated by a by a deposition, lithographic, and etch approach.

In an embodiment, in the case that a buffer stop is implemented (as described in association with FIG. 3), the buffer stop is a polymer such as polyimide. The polymer may be globally deposited and then patterned or may be deposited only in desired, e.g., by printing. In other embodiments, such a buffer stop is composed of a dielectric material such as, but not limited to, silicon dioxide ($SiO_2$), silicon nitride (SiN) or silicon oxynitride (SiON). In one such embodiment, the dielectric material is formed using a deposition technique such as, but not limited to, low pressure chemical vapor deposition (LPCVD), plasma enhanced chemical vapor deposition (PECVD), high density plasma chemical vapor deposition (HDPCVD) or physical vapor deposition (PVD).

It is to be appreciated that one or more embodiments described herein involve implementation of metallization that is single-level 'monolithic' across all sub-cells. Thus, the resulting cell metallization can be identical to the interconnect metallization and fabricated in the same process, at the same time. In one such embodiment, use of a monolithic metallization structure leads to implementation of cell isolation as completed subsequent all diodes being metallized. This is distinguished from conventional approaches where metallization is a multi-step process. In more particular embodiments, a monolithic metallization approach is implemented in conjunction with a buffer or protective layer (e.g., as described in association with FIG. 3) over which the monolithic metallization structure is formed. Such embodiments can allow for ablation stop on the buffer or protective layer without exposing the metal itself, as is described in greater detail below.

As described in association with FIG. 1B, a diced solar cell further includes an encapsulating material, e.g., ethylene vinyl alcohol (EVA), poly-olefin, disposed in the groove between adjacent ones of the singulated and physically separated semiconductor substrate portions. In one such embodiment, the encapsulant provides shunt resistance as well as wear resistance between adjacent sub-cell portions. In one embodiment, the encapsulant material has a dielectric breakdown strength greater than approximately 1000 V/cm, such that the material adequately provides shunt protection between adjacent sub-cells. In one embodiment, as applied, the encapsulant has sufficiently low viscosity or high melt-flow to ensure that the encapsulant material flows into the thin groove resulting from singulation. In one embodiment, the filling of the groove by the encapsulant acts to improve the mechanical strength of the system through formation of Si/metal/polymer composite.

In accordance with an embodiment of the present disclosure, each sub-cell of a diced solar cell has approximately a same voltage characteristic and approximately a same current characteristic. In an embodiment, the plurality of sub-cells is a plurality of in-parallel diodes, in-series diodes, or a combination thereof. In an embodiment, the solar cell and, hence, the sub-cell portions, is a back-contact solar cell, and the metallization structure is disposed on the back surface, opposite a light-receiving surface, of each of the singulated and physically separated semiconductor substrate portions. In one such embodiment, the back surface of each of the sub-cells has approximately a same surface area. In a particular embodiment, the light-receiving surface of each of the sub-cells is a texturized surface, as is described in greater detail below.

In accordance with an embodiment of the present disclosure, each of the singulated and physically separated semiconductor substrate portions is a bulk monocrystalline silicon substrate portion, such as fabricated from an N-type monocrystalline substrate. In one such embodiment, each silicon portion includes one or more N+ regions (e.g., phosphorous or arsenic doped regions) and one or more P+ regions (e.g., boron doped regions) formed in substrate itself. In other embodiments, each silicon portion includes one or more polycrystalline silicon N+ regions and one or more polycrystalline silicon P+ regions formed above a silicon substrate.

Figure 4A:
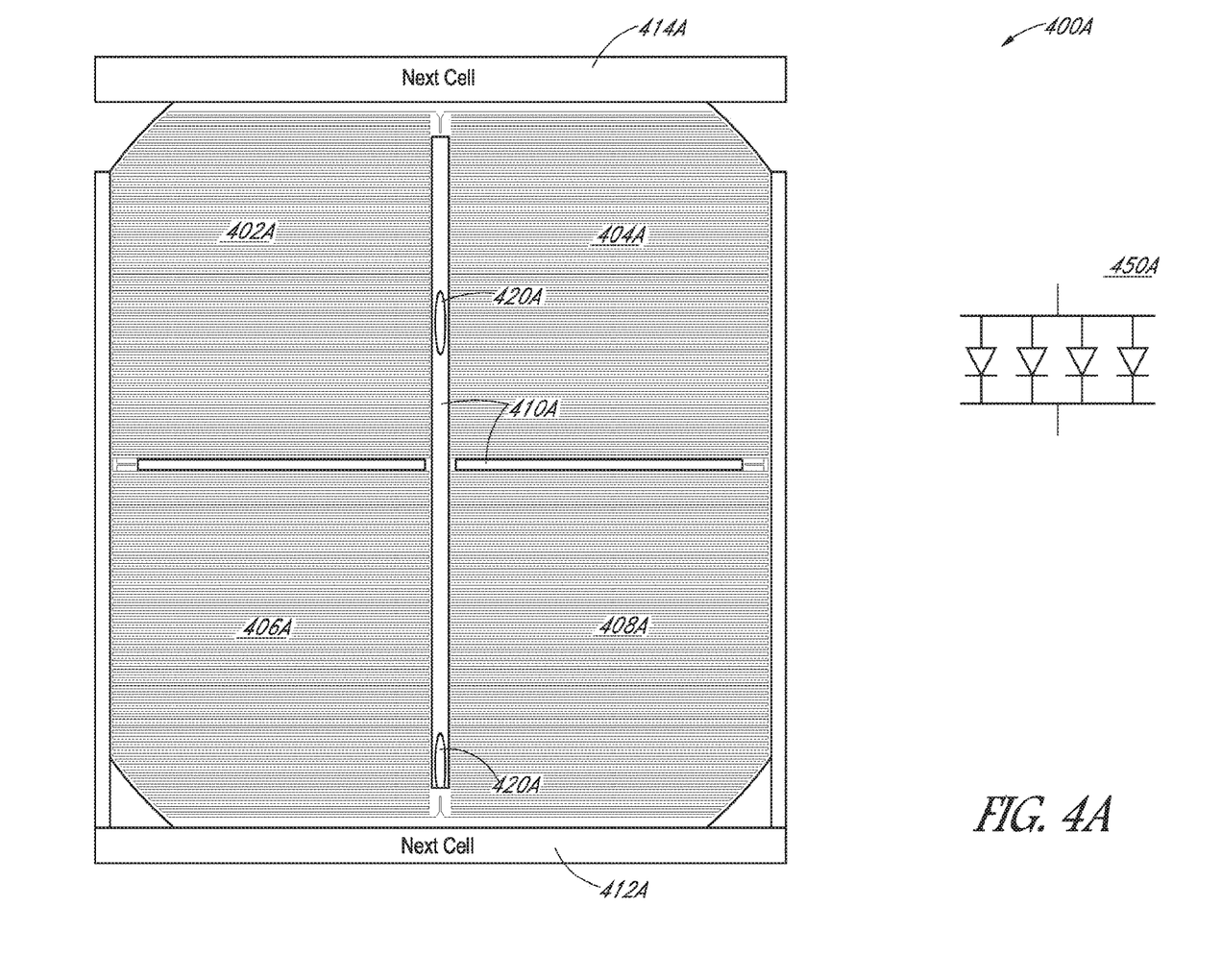
FIG. 4A illustrates a plan view from the metallization side of a solar cell that has been diced into four parallel connected sub-cells, in accordance with an embodiment of the present disclosure.

It is to be appreciated that a variety of arrangements of numbers and electrically coupling of sub-cells within a singulated solar cell may be contemplated within the spirit and scope of embodiments described herein. In a first example, FIG. 4A illustrates a plan view from the metallization side of a solar cell 400A that has been diced into four sub-cells, in accordance with an embodiment of the present disclosure. Referring to FIG. 4A, the solar cell 400A is singulated to provide four sub-cells 402A, 404A, 406A and 408A. Metallization lines 410A are used to hold the quad-cell design together where each of the sub-cells meet. In one embodiment, stress-relief features 420A are included in the metallization lines 410A, as depicted in FIG. 4A. Additionally, metallization coupling to a first next cell location 412A and a second next cell location 414A is depicted.

Referring again to FIG. 4A, a diode schematic 450A illustrates the electrical configuration of the parallel quad-cell design. In an embodiment, the individual sub-cells are ¼ current of a single diode full cell, and have the same voltage as the single diode cell, whereas the combined 4-diode full cell now having the same current, same voltage as full-size single diode cell. The scribe cut is performed on diffusion regions with lowest recombination post isolation. The metal line length is ½ standard cell with ¼ cell bridging, which would enable either a reduction of metal thickness for the same size cell, or allow scaling to larger wafers without needing to increase the metal thickness.

Figure 4B:
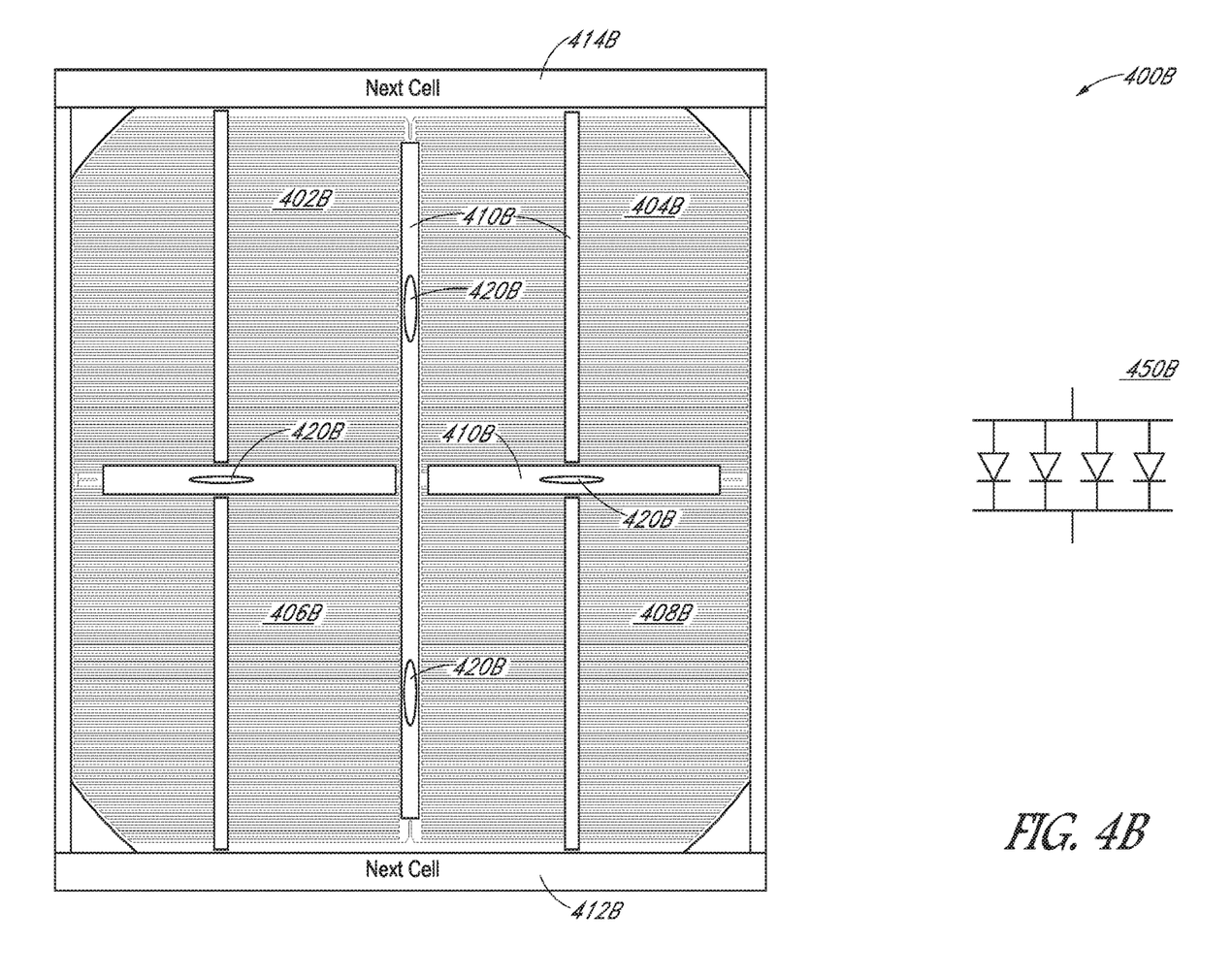
FIG. 4B illustrates a plan view from the metallization side of another solar cell that has been diced into four parallel sub-cells, in accordance with another embodiment of the present disclosure.

In a second example, FIG. 4B illustrates a plan view from the metallization side of another solar cell 400B that has been diced into four sub-cells, in accordance with another embodiment of the present disclosure. Referring to FIG. 4B, the solar cell 400B is singulated to provide four sub-cells 402B, 404B, 406B and 408B. Metallization lines 410B are used to hold the quad-cell design together where each of the sub-cells meet. In one embodiment, stress-relief features 420B are included in the metallization lines 410B, as depicted in FIG. 4B. Additionally, metallization coupling to a first next cell location 412B and a second next cell location 414B is depicted.

Referring again to FIG. 4B, a diode schematic 450B illustrates the electrical configuration of the parallel quad-cell design. In an embodiment, the sub-cells are ¼ current, same voltage sub-cells, with the combined full cell being same current, same voltage. The scribe cut is performed on diffusion regions with lowest recombination post isolation. The metal line length is ¼ standard cell.

Figure 5A:
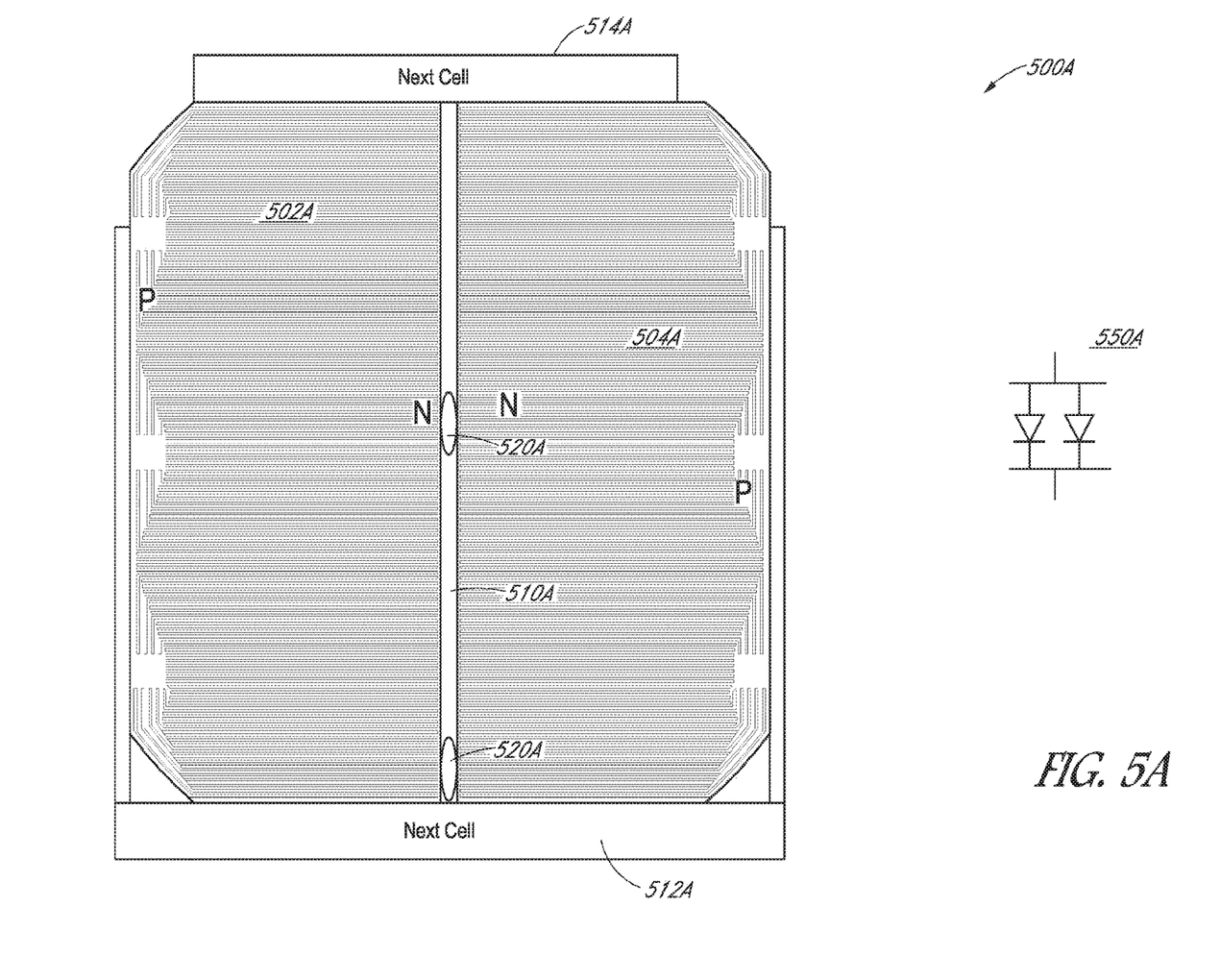
FIG. 5A illustrates a plan view from the metallization side of a solar cell that has been diced into two sub-cells in a parallel arrangement, in accordance with an embodiment of the present disclosure.

In a third example, FIG. 5A illustrates a plan view from the metallization side of a solar cell 500A that has been diced into two sub-cells in a parallel arrangement, in accordance with an embodiment of the present disclosure. Referring to FIG. 5A, the solar cell 500A is singulated to provide two sub-cells 502A and 504A. A metallization line 510A is used to hold the dual-cell design together where each of the sub-cells meet. In one embodiment, stress-relief features 520A are included in the metallization line 510A, as depicted in FIG. 5A. Additionally, metallization coupling to a first next cell location 512A and a second next cell location 514A is depicted.

Referring again to FIG. 5A, a diode schematic 550A illustrates the electrical configuration of the parallel dual-cell design. In an embodiment, the sub-cells are ½ current, same voltage sub-cells, with the combined full cell being same current, same voltage. The scribe cut is performed on diffusion regions with lowest recombination post isolation. The metal line length is ½ standard cell to provide a single metal joint holding two half cells together.

Figure 5B:
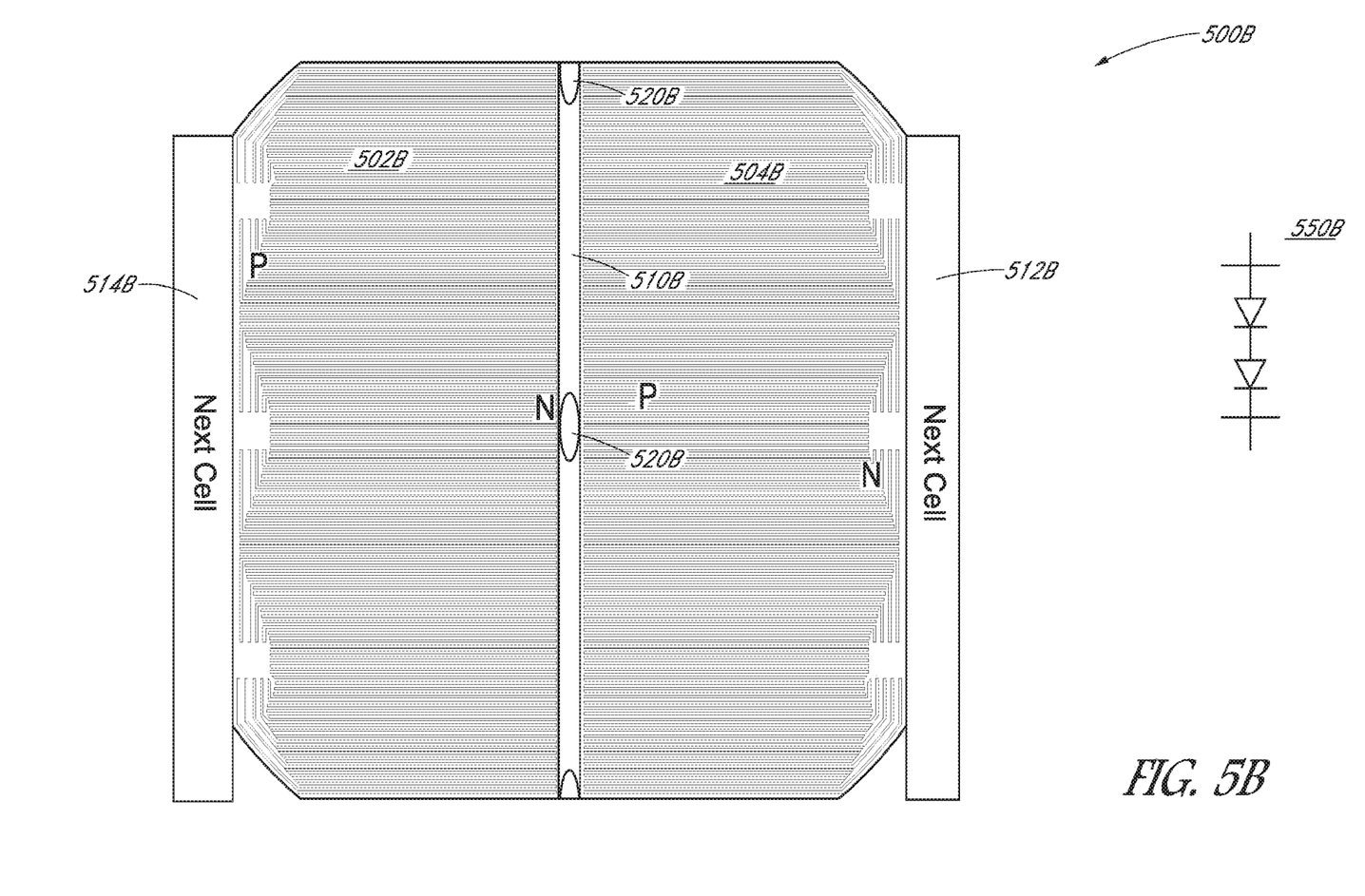
FIG. 5B illustrates a plan view from the metallization side of a solar cell that has been diced into two sub-cells in an in series arrangement, in accordance with an embodiment of the present disclosure.

In a fourth example, FIG. 5B illustrates a plan view from the metallization side of a solar cell 500B that has been diced into two sub-cells in a series arrangement, in accordance with an embodiment of the present disclosure. Referring to FIG. 5B, the solar cell 500B is singulated to provide two sub-cells 502B and 504B. A metallization line 510B is used to hold the dual-cell design together where each of the sub-cells meet. In one embodiment, stress-relief features 520B are included in the metallization line 510B, as depicted in FIG. 5B. Additionally, metallization coupling to a first next cell location 512B and a second next cell location 514B is depicted.

Referring again to FIG. 5B, a diode schematic 550B illustrates the electrical configuration of the in series dual-cell design. In an embodiment, the sub-cells are ½ current of a single diode full cell, with the same voltage, with the combined full cell being ½ the current, but twice voltage of a single diode cell of the same size. The scribe cut is performed along the emitter junction. The metal line length is ½ standard cell to provide a single metal joint holding two half cells together.

With reference again to FIGS. 4A, 4B, 5A and 5B, it is to be appreciated that a plurality of solar cells each singulated into sub-cells may be included in a photovoltaic (PV) module. In one such embodiment, for each solar cell, an encapsulating material of a laminate of the PV module is disposed in the groove between adjacent ones of the singulated and physically separated semiconductor substrate portions. That is, in one embodiment, subsequent to scribing the semiconductor substrate, the solar cells are embedded in a photovoltaic (PV) module laminate. An encapsulating material of the PV module laminate fills the groove between adjacent ones of the singulated and physically separated semiconductor substrate portions. Furthermore, cell-to-cell interconnection within the PV module may involve interconnection in series, in parallel, or a combination thereof.

Figure 5C:
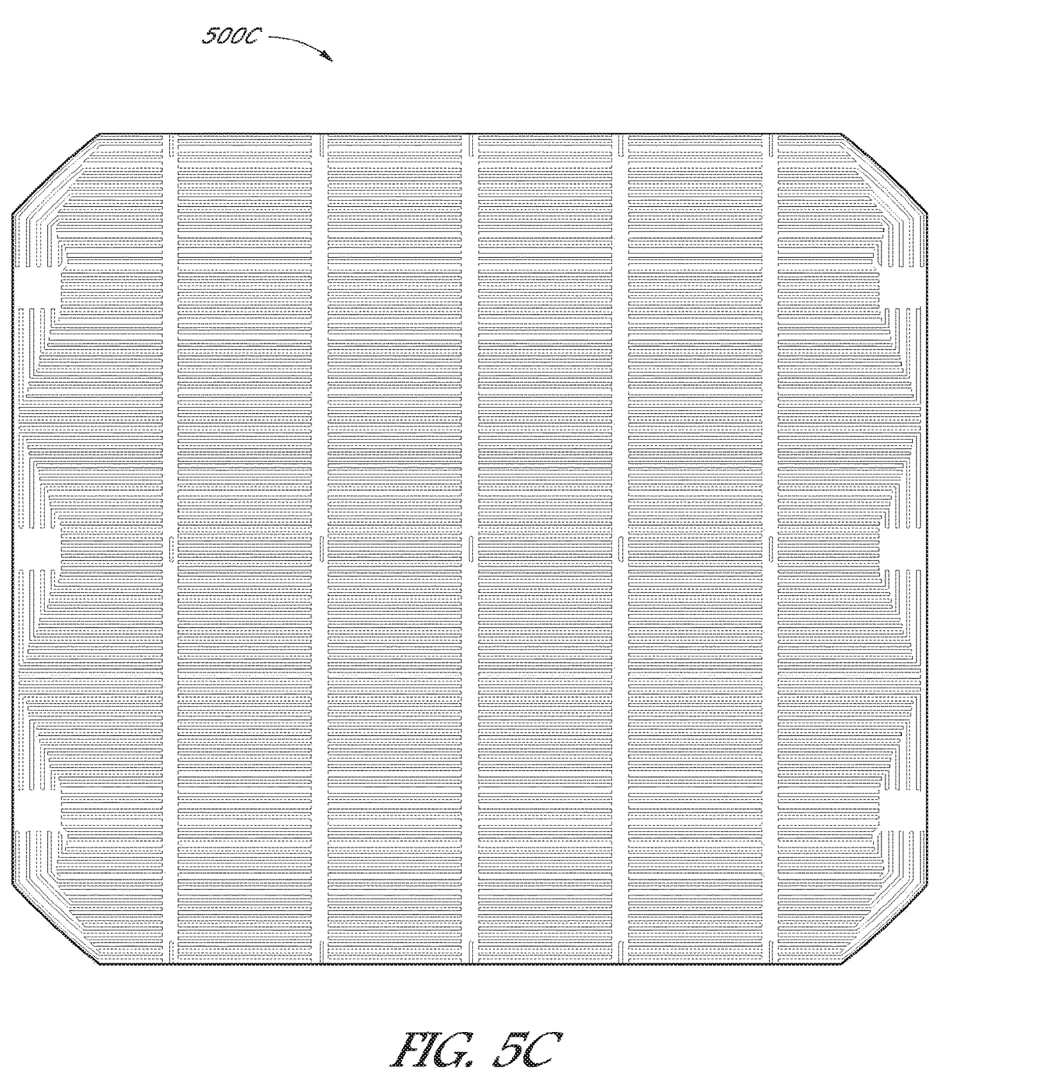
FIG. 5C illustrates a plan view from the metallization side of a solar cell that has been diced into six sub-cells in a series arrangement, in accordance with an embodiment of the present disclosure.
Figure 5D:
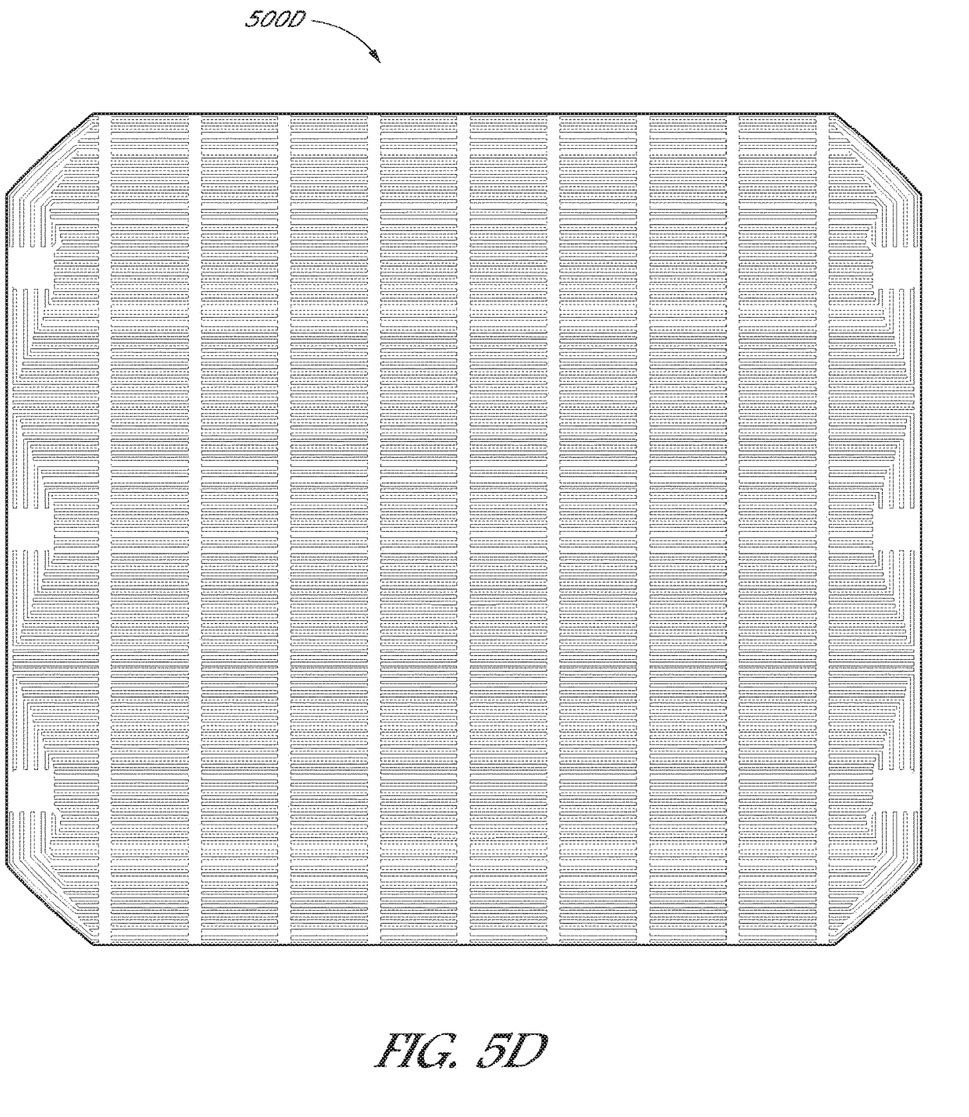
FIG. 5D illustrates a plan view from the metallization side of a solar cell that has been diced into ten sub-cells in a series arrangement, in accordance with an embodiment of the present disclosure.

It is to be appreciated that other arrangements for sub-cells may also be achieved using approaches described herein, such as, but not limited to, 3×3, 4×4, etc., type arrangements. Also, a combination of series and parallel configurations of sub-cells within an original cell is also accessible. Approaches may be beneficial for both back contact and front contact based cells. As exemplary additional arrangements, FIG. 5C illustrates a plan view from the metallization side of a solar cell 500C that has been diced into six sub-cells in a series arrangement, in accordance with an embodiment of the present disclosure. FIG. 5D illustrates a plan view from the metallization side of a solar cell 500D that has been diced into ten sub-cells in a series arrangement, in accordance with an embodiment of the present disclosure. Referring to FIG. 5D, a full-size cell is made with 10 sub-diodes within the cell, arranged in a series connection. The voltage of the combined cell is 10× a single diode-cell of the same size, i.e., about 6.3 Vmp. The current in the combined cell is approximately $\frac{1}{10}^{th}$ the current of the original cell (e.g., about 0.5 A). The cell 500D, in an embodiment, can be used directly to charge a USB for consumer charging applications, or if built in to a 96 cell module, can produce a module voltage of approximately 600V. The 10× reduction in current for this type of cell design can improve the reliability and safety through reduction in peak temperatures caused my resistive heating. Also, for AC power applications that require inverters, scaling the voltage to match the inverter output will save significantly on the inverter component costs, namely in the step-up power electronics required to go from the standard panel voltage (e.g., approximately 50V), up to a typical residential or commercial power need (approximately 240 Vrms AC).

In another aspect, approaches to favorable solar cell singulation are considered. For example, singulation may be implemented to take advantage of crack-tolerant properties of standard silicon substrate based cells as a design feature. In one such embodiment, a standard size cell is plated with x-sub-diodes and a deliberate crack is introduced. Dicing of the cell is performed through the silicon (Si) only while the metallization structures stay intact. A metal bridge ultimately holds the diced silicon together. In some embodiments integral strain relief is incorporated into the resulting arrangements.

Figure 6:
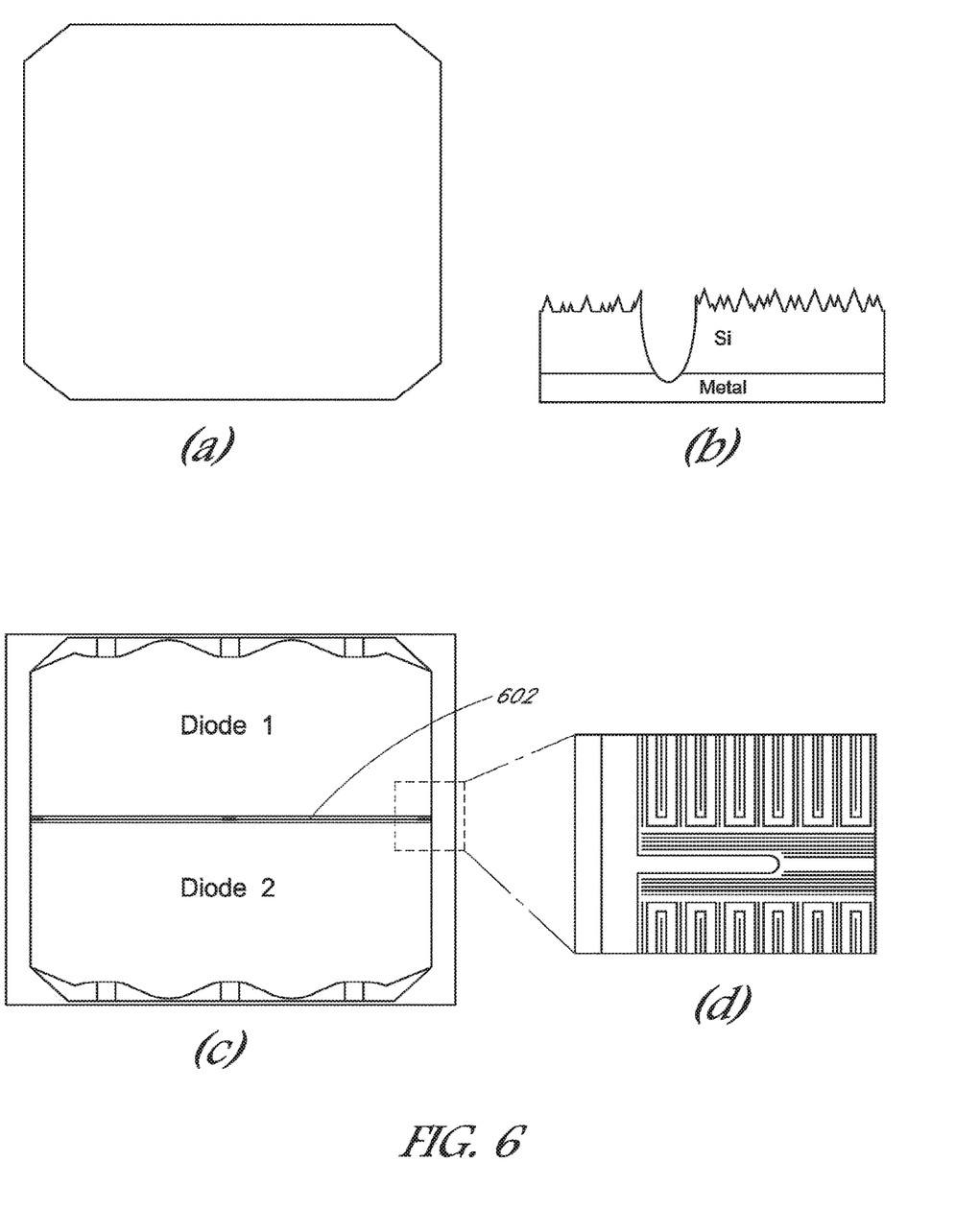
FIG. 6 illustrates a representative example of cell singulation considerations and approaches, in accordance with one or more embodiments of the present disclosure.

As a representative example of cell singulation considerations and approaches, FIG. 6 illustrates, in accordance with one or more embodiments of the present disclosure, (a) a front side (light-receiving side) of a solar cell. In (b), a schematic is provided illustrating a cross-sectional view of a scribed silicon substrate and bridging metal. In (c), the back side of the scribed substrate is shown as sub-cells corresponding to diode 1 and diode 2, where a plated metal 602 holds the two sub-cells together. In (d), a blown-up view of a strain relief feature is shown.

Figure 7:
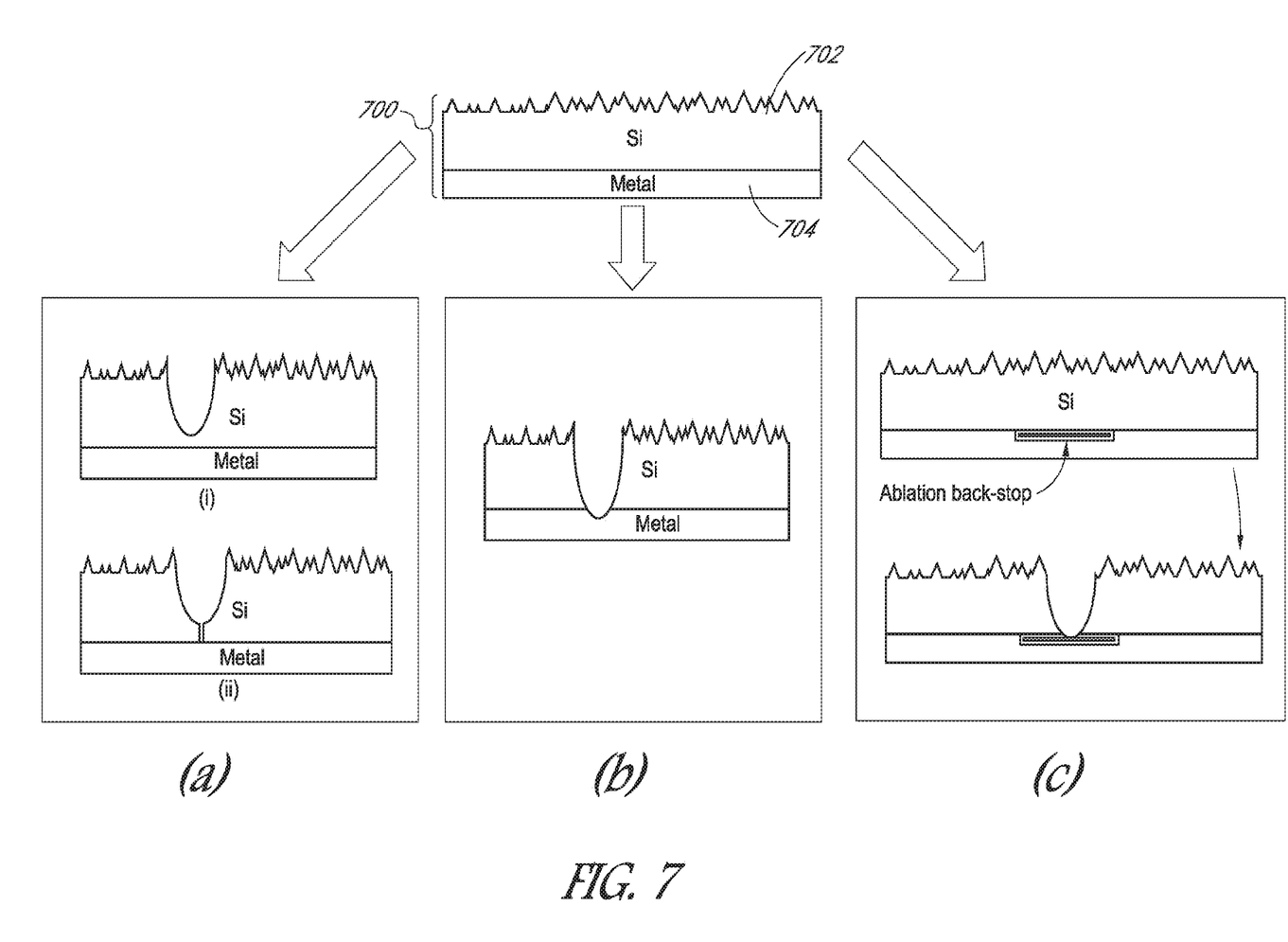
FIG. 7 illustrates three possible pathways for laser scribing for singulation of a solar cell to form sub-cells, in accordance with an embodiment of the present disclosure.

FIG. 7 illustrates three possible pathways for laser scribing for singulation of a solar cell to form sub-cells, in accordance with an embodiment of the present disclosure. Referring to FIG. 7, a solar cell 700 includes a silicon substrate 702 and a metallization structure 704 on a back side of the silicon substrate.

Referring to pathway (a) of FIG. 7, a scribe plus break approach is depicted where (i) the substrate is partially scribed (e.g., approximately 70% depth) and then (ii) cracked along the break to terminate at the metallization structure. Referring to pathway (B) of FIG. 7, a scribe-only approach is depicted where the laser ablation of the silicon stops on (or partially into) a metal of the metallization structure. Referring to pathway (a) of FIG. 7, a scribe plus damage buffer break approach is depicted where the laser ablation of the silicon is performed through the entire depth of the silicon and then stops on (or partially into) a damage buffer layer distinct from the metal of the metallization structure. In any of these cases, laser parameter, an option includes pico-second laser ablation having a cleaner process, lower recombination, and narrower scribe width. Another option includes a nano-second or longer laser having wider scribe lines and higher throughput but increased recombination and potential for debris.

Figure 8:
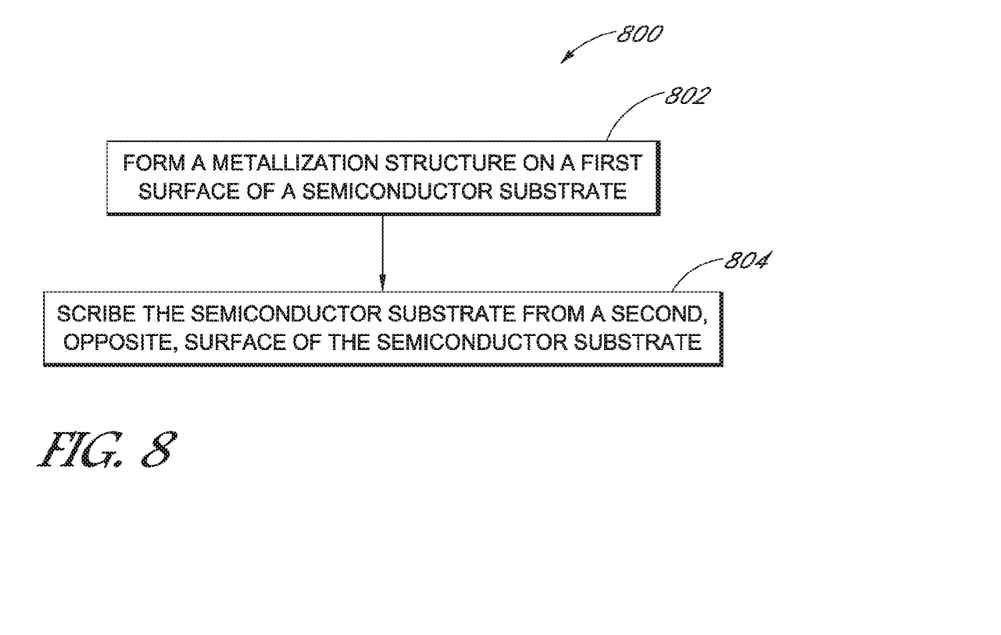
FIG. 8 is a flowchart representing operations in a method of fabricating a solar cell using singulation to form sub-cells, in accordance with an embodiment of the present disclosure.

With reference now to flowchart 800 of FIG. 8, in an embodiment, a method of fabricating a solar cell involves forming a metallization structure on a first surface of a semiconductor substrate, as shown in operation 802 of flowchart 800. The method then involves scribing the semiconductor substrate from a second, opposite, surface of the semiconductor substrate, as shown in operation 804 of flowchart 800. In one such embodiment, the scribing is stopped by and exposing portions of the metallization structure from the second surface.

In an embodiment, the scribing is stopped by interconnect metal of the metallization structure. In other embodiments, however, a damage buffer is used to protect the metal of the metallization structure. In one such embodiment, the damage buffer is a polymer material, as described above. In another embodiment, the damage buffer is a metal distinct from the metal of the metallization structure. In another embodiment, the damage buffer is mesh material for through plating. In the last example, since the cracking/separation of the Si could crack or damage the metal and thereby reducing its reliability, there are several options such as printing or taping a damage buffer prior to metallization to act as a crack/laser stop.

In an embodiment, forming the metallization structure on the first surface of the semiconductor substrate involves patterning a metal foil formed on the first surface of the semiconductor substrate. In other embodiments, however, the metallization structure is formed by printing a metal, plating a metal or stack of metals, or by a metal deposition and etch process. In any case, in an embodiment the metallization structure is formed to have mechanical properties sufficient to bridge two sub-cells together through all reliability testing performed in the fabrication and test procedure.

In an embodiment, the scribing involves scribing with a laser. However, it is to be appreciated that a mechanical scribing process may be implemented instead of or in conjunction with a laser scribing process. For example, in a particular embodiment, a partial laser scribe is performed, followed by breaking or sawing with depth control.

In an embodiment, the method of cell fabrication further involves texturizing the second surface (light-receiving surface) of the semiconductor substrate prior to scribing the semiconductor substrate. In one such embodiment, performing the operations in this order can mitigate dicing damage. In one such embodiment, a partial grooving of the wafer is first performed, and then any damage is removed during silicon etch process (e.g., texturing). However, in other embodiment, the scribing may be performed and then a subsequent wet etch is implemented. In any case, texturizing of the light-receiving surface of the solar cell can, in one embodiment, involve texturizing using a hydroxide-based etch process. It is to be appreciated that a texturized surface may be one which has a regular or an irregular shaped surface for scattering incoming light, decreasing the amount of light reflected off of the light-receiving surface of the solar cell. Additional embodiments can include formation of a passivation or anti-reflective coating layer on the light-receiving surface.

Figure 9:
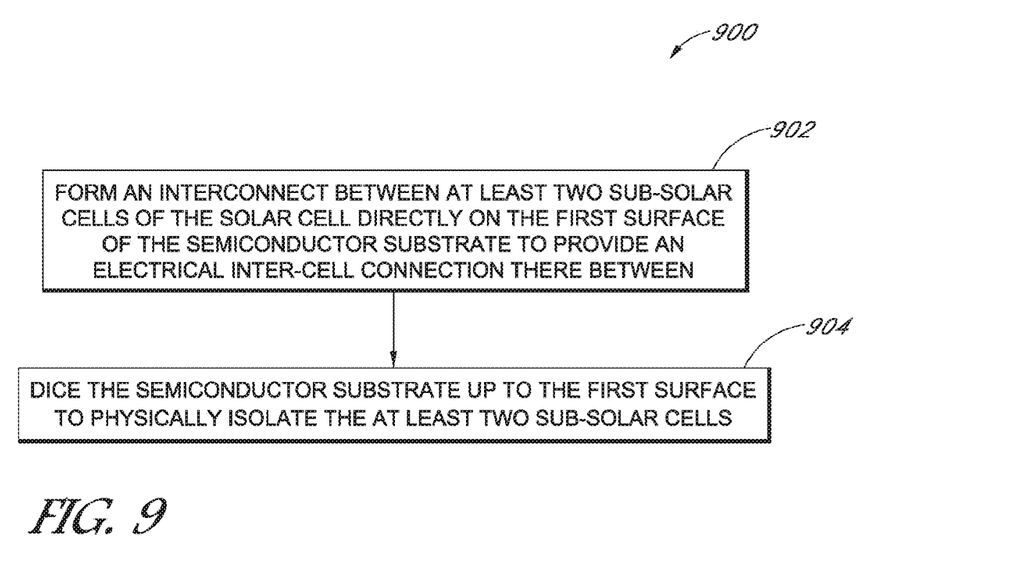
FIG. 9 is a flowchart representing operations in another method of fabricating a solar cell using singulation to form sub-cells, in accordance with another embodiment of the present disclosure.

With reference now to flowchart 900 of FIG. 9, in an embodiment, a method of fabricating a solar cell including a semiconductor substrate having a first surface involves forming an interconnect between at least two sub-solar cells of the solar cell directly on the first surface of the semiconductor substrate to provide an electrical inter-cell connection there between, as shown in operation 902 of flowchart 900. The method then involves dicing the semiconductor substrate up to the first surface to physically isolate the at least two sub-solar cells, as shown in operation 904 of flowchart 900.

In an embodiment, forming the interconnect between at least two sub-solar cells of the solar cell further involves forming a metallization structure on the first surface of the semiconductor substrate of the solar cell. In an embodiment, dicing the semiconductor substrate further involves scribing the semiconductor substrate from a second, opposite, surface of the semiconductor substrate. In one such embodiment, the scribing is stopped upon exposing portions of the metallization structure from the second surface.

In an embodiment, scribing the semiconductor substrate further involves forming a groove between the at least two sub-solar cells such that the metallization structure electrically couples portions of the at least two sub-solar cells. In that embodiment, the method further involves forming an encapsulating material in the groove.

In an embodiment, dicing the semiconductor substrate further involves forming at least one diode in each of the at least two sub-solar cells. Each of the at least two sub-solar cells are formed to have approximately a same voltage characteristic and approximately a same current characteristic. In one such embodiment, forming at least one diode in each of the at least two sub-solar cells further involves forming a P-type dopant region and a N-type dopant region in the at least one diode of each of the at least two sub-solar cells, forming a first metal contact to the P-type dopant region, and forming a second metal contact to the N-type dopant region.

In an embodiment, the metallization structure is formed substantially simultaneously to forming of the metallization structure by plating one or more metal films on portions of the first surface of the semiconductor substrate. In one such embodiment, the metallization structure is formed in a same process operation used to plate one or more metal films on portions of the first surface of the semiconductor substrate. However, in other embodiments, forming the metallization structure involves patterning a metal foil formed on the first surface of the semiconductor substrate. In an embodiment, the method further involves, prior to scribing the semiconductor substrate, texturizing the second surface of the semiconductor substrate.

Overall, although certain materials are described specifically above, some materials may be readily substituted with others with other such embodiments remaining within the spirit and scope of embodiments of the present disclosure. For example, in an embodiment, a different material substrate, such as a group III-V material substrate, can be used instead of a silicon substrate. In another embodiment, a polycrystalline or multi-crystalline silicon substrate is used. Furthermore, it is to be understood that, where N+ and P+ type regions are described specifically, other embodiments contemplated include a switched conductivity type, e.g., P+ and N+ type regions, respectively.

One or more benefits or advantages of embodiments described herein can include enabling the use of larger wafers (e.g., 156 cm) without having to implement additional metal for solar cell fabrication. Embodiments can be implemented to enable scalable voltage and current designs, including high voltage designs, such as previously described for 5V USB applications, or 120/240 Vrms inverter applications. One or more embodiments involve use of a standard cell fabrication process without altering fab modules already in place for conventional cell fabrication. There may be no need for special handling or use of additional sub-cell interconnections. Power loss due to metal grid resistance can be reduced proportional to the square of the length of the metal grid finger. Finally, efficiency benefits may be achieved based on lower current and potentially more reliable cell fabrication.

Thus, solar cells having a plurality of sub-cells coupled by metallization structures, and singulation approaches to forming solar cells having a plurality of sub-cells coupled by metallization structures, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
   a plurality of physically separated sub-cells formed upon singulation of a silicon substrate of a photovoltaic solar cell, the plurality of physically separated sub-cells comprising a scribe portion between pairs of ones of the singulated and physically separated sub-cells, wherein the scribe portion is disposed through the entire depth of the silicon substrate; and
   a metallization structure located over and covering the scribe portion from end-to-end between the pairs of the ones of the plurality of singulated and physically separated sub-cells, the metallization structure bonded to a back surface, opposite a light-receiving surface, of each of the plurality of singulated and physically separated sub-cells, wherein the metallization structure electrically bridges at least two of the plurality of singulated and physically separated sub-cells, wherein the metallization structure electrically interconnects a first doped region of a first of the at least two of the plurality of singulated and physically separated sub-cells and a second doped region of a second of the at least two of the plurality of singulated and physically separated sub-cells.

2. The solar cell of claim 1, wherein the metallization structure comprises a metal foil.

3. The solar cell of claim 1, wherein the metallization structure comprises an aluminum foil.

4. The solar cell of claim 1, wherein the metallization structure comprises a plated metal.

5. The solar cell of claim 1, wherein the metallization structure comprises a ribbon.

6. The solar cell of claim 1, wherein the plurality of singulated and physically separated sub-cells is a plurality of in-parallel diodes, in-series diodes, or a combination thereof.

7. The solar cell of claim 1, wherein the silicon substrate comprises a bulk monocrystalline silicon substrate.

8. The solar cell of claim 1, wherein the metallization structure is a continuous metallization structure.

9. The solar cell of claim 1, wherein each of the scribe portions comprises a curved surface.

10. A solar cell, comprising:
a plurality of physically separated sub-cells formed upon singulation of a silicon substrate of a photovoltaic solar cell, the plurality of physically separated sub-cells comprising a scribe portion between pairs of ones of the singulated and physically separated sub-cells, wherein the scribe portion is disposed through the entire depth of the silicon substrate; and
a metallization structure located over and covering the scribe portion from end-to-end between the pairs of the ones of the plurality of singulated and physically separated sub-cells, the metallization structure bonded to a back surface, opposite a light-receiving surface, of each of the plurality of singulated and physically separated sub-cells, the scribe portion disposed partially into the metallization structure, wherein the metallization structure electrically bridges at least two of the plurality of singulated and physically separated sub-cells.

11. The solar cell of claim 10, wherein the metallization structure comprises a metal foil.

12. The solar cell of claim 10, wherein the metallization structure comprises an aluminum foil.

13. The solar cell of claim 10, wherein the metallization structure comprises a material selected from the group consisting of plated metal and a ribbon.

14. The solar cell of claim 10, wherein the plurality of singulated and physically separated sub-cells is a plurality of in-parallel diodes, in-series diodes, or a combination thereof.

15. The solar cell of claim 10, wherein the silicon substrate comprises a bulk monocrystalline silicon substrate.

16. A solar cell, comprising:
a plurality of physically separated sub-cells formed upon singulation of a silicon substrate of a photovoltaic solar cell, the plurality of physically separated sub-cells comprising a scribe portion between pairs of ones of the singulated and physically separated sub-cells, wherein the scribe portion is disposed through the entire depth of the silicon substrate;
a metallization structure located over and covering the scribe portion from end-to-end between the pairs of the ones of the plurality of singulated and physically separated sub-cells, the metallization structure bonded to a back surface, opposite a light-receiving surface, of each of the plurality of singulated and physically separated sub-cells, wherein the metallization structure electrically bridges at least two of the plurality of singulated and physically separated sub-cells; and
a damage buffer portion disposed on the metallization structure and between pairs of ones of the singulated and physically separated sub-cells, wherein the scribe portion disposed on the damage buffer portion.

17. The solar cell of claim 16, wherein the scribe portion is disposed partially into the damage buffer portion.

18. The solar cell of claim 16, wherein the damage buffer portion comprises a polymer material.

19. The solar cell of claim 16, wherein the damage buffer portion comprises a metal distinct from the metallization structure.

20. The solar cell of claim 16, wherein the damage buffer portion comprises a material selected from the group consisting of a printed material and a tape.

21. The solar cell of claim 1, wherein the metallization structure has a strain relief feature therein, the strain relief feature over a portion of the scribe portion between the pairs of the ones of the plurality of singulated and physically separated sub-cells.

22. The solar cell of claim 21, wherein the strain relief feature comprises and opening.

23. The solar cell of claim 1, wherein the metallization structure covers an entirety of the scribe portion between the pairs of the ones of the plurality of singulated and physically separated sub-cells.

* * * * *